(12) United States Patent
Draxelmayr

(10) Patent No.: US 7,142,143 B2
(45) Date of Patent: Nov. 28, 2006

(54) TIME-CONTINUOUS SIGMA/DELTA ANALOG-TO-DIGITAL CONVERTER

(75) Inventor: Dieter Draxelmayr, Villach (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/067,602

(22) Filed: Feb. 26, 2005

(65) Prior Publication Data

US 2005/0206543 A1 Sep. 22, 2005

(30) Foreign Application Priority Data

Feb. 27, 2004 (DE) .................... 10 2004 009 611

(51) Int. Cl.
*H03M 3/00* (2006.01)
(52) U.S. Cl. .................. 341/143; 341/155; 341/172
(58) Field of Classification Search ................ 341/143, 341/155
See application file for complete search history.

(56) References Cited

U.S. PATENT DOCUMENTS

| | | | | |
|---|---|---|---|---|
| 3,761,841 A | * | 9/1973 | Jacquart | 341/143 |
| 5,274,375 A | * | 12/1993 | Thompson | 341/143 |
| 6,340,945 B1 | * | 1/2002 | Hauptmann et al. | 341/172 |
| 6,369,730 B1 | * | 4/2002 | Blanken et al. | 341/143 |
| 6,507,301 B1 | * | 1/2003 | Locher | 341/143 |
| 6,584,157 B1 | * | 6/2003 | Van Der Zwan et al. | 375/247 |
| 6,836,228 B1 | * | 12/2004 | Levinson et al. | 341/136 |
| 6,897,796 B1 | * | 5/2005 | Dias et al. | 341/143 |
| 6,927,718 B1 | * | 8/2005 | Koch | 341/143 |

OTHER PUBLICATIONS

Gerfers et al., "A Clock Jitter Insensitive Multibit DAC Architecture for High- Performance Low- Power Continuous-Time ΣΔ Modulators", Proceedings of the 2003 10th IEEE Conference on Electronics, Circuits and Systems, Dec. 14-17, 2003, pp. 958-961, (4 pages).
Luh et al., "Feed Forward Gain Compensation for CMOS Continuous-Time ΣΔ Modulators", 6th Annual IEEE International Conference on Electronics, Circuits and Systems, Sep. 5-8, 1999, vol. 3, pp. 1685-1688.

* cited by examiner

*Primary Examiner*—Rexford Barnie
*Assistant Examiner*—Khai M. Nguyen
(74) *Attorney, Agent, or Firm*—Maginot Moore Beck

(57) ABSTRACT

Time-continuous sigma/delta analog-to-digital converter for converting an analog input signal into a digital output signal (D), having at least one analog filter (3) which filters the analog input signal present at a signal input (2) of the analog filter (3), a quantizer (12) which is clocked by a clock signal (CLK) and quantizes the filtered analog signal, output by the analog filter (3), in order to generate the digital output signal (D), and having at least one reference capacitor (28) which can be continuously charged to a reference voltage ($V_{REF}$) by a current source (31) for displacing a constant charge (Q) to/from the analog filter (3), such that no voltage jumps occur at the analog filter (3).

20 Claims, 8 Drawing Sheets

NRZ

RZ

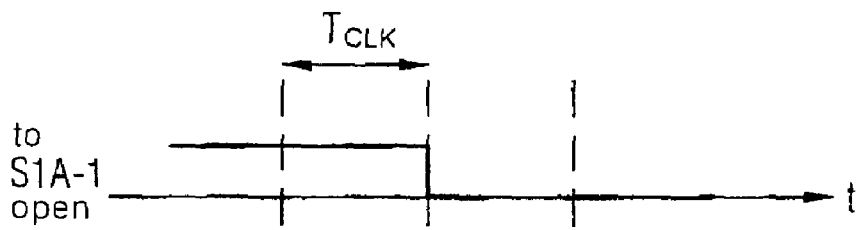
FIG 10A
FIG 10B
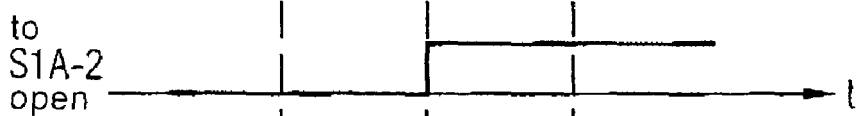
FIG 10C
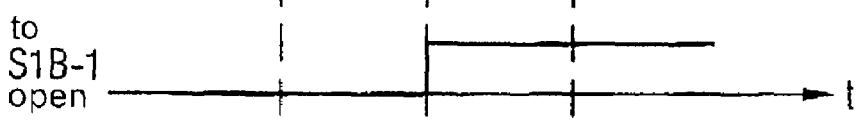
FIG 10D
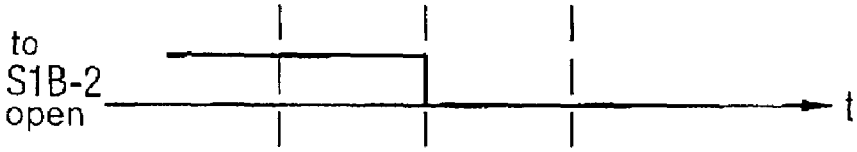
FIG 10E
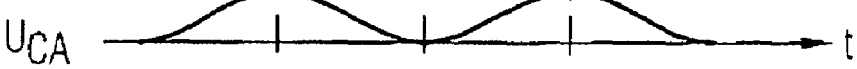
FIG 10F
FIG 10G
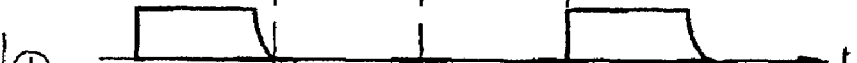
FIG 10H
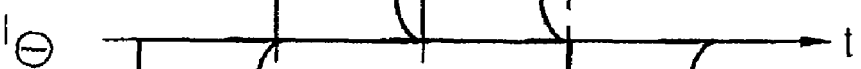

TIME-CONTINUOUS SIGMA/DELTA ANALOG-TO-DIGITAL CONVERTER

FIELD OF THE INVENTION

The invention relates to a time-continuous sigma/delta analog-to-digital converter for converting an analog input signal into a digital output signal.

BACKGROUND

FIG. 1 shows a time-continuous sigma/delta analog-to-digital converter according to the prior art. The conventional sigma/delta analog-to-digital converter firstly converts an analog input signal in a sigma/delta pulse density modulator into a high-frequency serial bit sequence normally having single bit resolution, that is to say into a high-frequency coarsely quantized sample value. The modulator output signal is converted into highly resolving parallel words, which have a substantially lower sampling rate, by subsequent digital low pass filtering. The energy of the quantization noise is distributed uniformly over a wide frequency band by the oversampling.

A sigma/delta analog-to-digital converter (ΣΔADC) comprises two main constituents, specifically a delta/sigma modulator and a digital filter. Firstly, an analog-to-digital conversion of low resolution, for example single bit resolution, is executed, and the quantization noise is subsequently greatly reduced by digital filtering.

The sigma/delta modulator according to the prior art as illustrated in FIG. 1 has a feedback loop which comprises a subtractor, an integrator, a coarse quantizer or comparator and a digital-to-analog converter in the feedback branch. The quantizer comprises an analog-to-digital converter (ADC) of low resolution but with a high sampling rate, which supplies a digital output signal. The digital-to-analog converter (DAC) provided in the feedback branch generates from the digital output signal sequence a quantized analog signal or approximation signal that is subtracted at the subtractor from the analog input signal. In an implementation that is simple in terms of circuitry, the digitization or quantization is performed merely with single bit resolution, the quantizer being implemented by a simple Schmitt trigger or analog comparator. The approximation signal is compared with the analog input signal in the feedback loop, and the difference is fed in an integrated fashion to the quantizer. The control loop corrects the arithmetic mean value of the approximation voltage to the mean value of the input voltage.

FIG. 2 shows a sigma/delta modulator according to the prior art that is of simple design in terms of circuitry. The integrator is implemented in this case by an operational amplifier whose output is fed back via a capacitor to the inverting signal input of the operational amplifier. The output of the integration amplifier specifies the integrated signal at the input of a threshold comparator which supplies a digital output signal of single bit resolution. The digital output signal is fed back via an inverter and via a resistor R to a summing node which is connected to the inverting input of the operational amplifier.

The main difficulty in implementing sigma/delta analog-to-digital converters is generating the analog feedback signal fed back to the integrator. The analog feedback signal output by the digital-to-analog converter DAC should map the digital output signal as exactly as possible. In the case of a conventional sigma/delta modulator according to the prior art, as illustrated in FIGS. 1 and 2, a logically high data bit of the digital output signal (HIGH) is applied as a first reference voltage (for example $V_{REF}1=1$ volt) to the inverting signal input of the operational amplifier, and a logically low signal (low) of the digital signal is fed back as a second reference voltage (for example $V_{REF}2=0$ volt) to the inverting signal input of the operational amplifier.

FIG. 3 shows two approximation signals fed back to the signal input of the integrator I and which correspond to different bit sequences of the output signal. The first data bit sequence "0 1 0 1" and the second data bit sequence "0 1 1 0" are fed back in the case of the feedback signals illustrated in FIG. 3 as NRZ (Non Return to Zero) data signals to the integrator I. As may be seen from comparing FIGS. 3a and 3b, the voltage integral of the two feedback signals, which corresponds to the charge Q fed to the integrator I or drawn from the integrator I, differs for the two different data bit sequences, although they ideally have to be equal in order to ensure complete linearity of the analog-to-digital converter ADC. In order to raise the linearity, the approximation signal is therefore fed back as RZ (Return to Zero) signal, as illustrated in FIGS. 4a, 4b. As may be seen from FIGS. 4a, 4b, the voltage integral, which corresponds to the charge Q displaced to/from the integrator I, is the same for both data bit sequences, and so the linearity of the analog-to-digital converter is greatly improved by comparison with the fed back approximation signals illustrated in FIGS. 3a, 3b.

The disadvantage in the case of the approximation signals illustrated in FIGS. 4a, 4b is, however, that they are particularly sensitive to clock jitter of the clock signal (CLK). The reason for this is that in the case of the RZ approximation signals in accordance with FIG. 4, the signal pulse length is reduced by comparison with the NRZ approximation signals which are illustrated in FIGS. 3a, 3b, and so a clock jitter of the signal edges has a stronger effect on the displaced charge Q or the voltage integral. In order to reduce the sensitivity of time-continuous sigma/delta analog-to-digital converters with respect to clock jitter, use is therefore made of more strongly switched capacitors in the feedback branch of the sigma/delta modulator, as illustrated in FIG. 5. A switch S is driven by the clock signal CLK, and alternately switches a reference capacitor $C_{REF}$ to a reference voltage (ground) and to the inverting signal input of the operational amplifier. The comparator output is connected via a control logic to an inverter INV, and via a reference resistance $R_{REF}$ to the reference capacitor $C_{REF}$. The reference capacitor $C_{REF}$ is precharged with the corresponding digital output signal in a first clock phase, and transfers a charge packet $Q=C·\Delta U$ to the integrator in a second clock phase when the switch S switches the reference capacitor $C_{REF}$ to the inverting input of the operational amplifier. Charge packets of constant charge Q are displaced in the second clock phase, the direction of the charge displacement depending on whether the inverter receives a falling or rising signal edge from the control logic. The recharging of the capacitor $C_{REF}$ is performed with an exponentially falling signal edge whose time constant is $\tau=R_{REF}\times C_{REF}$. Because of the falling signal pulse shape, the charge Q displaced by a clock cycle T varies only slightly when clock jitter occurs, and so the linearity of the time-continuous sigma/delta analog-to-digital converter in accordance with FIG. 5 is less sensitive to clock jitter when it occurs than are the analog-to-digital converters illustrated in FIGS. 1 and 2.

FIG. 6 shows a further sigma/delta modulator according to the prior art, which uses a switched capacitor in the feedback branch. Two switches S1, S2 are driven by a switch control logic as a function of the digital output signal of a comparator.

In a first logic state (D=1) of the digital output signal D, the two switches S1, S2 are switched in phase, that is to say the two switches S1, S2 switch the reference capacitor $C_{REF}$ at the same instant to ground (GND) and, in the next clock phase, on the one hand to the inverting signal input of the operational amplifier and to a reference voltage source, which supplies a reference voltage $V_{REF}$. In the first clock phase when both switches S1, S2 are in the left-hand switch position, the reference capacitor $C_{REF}$ is discharged. In the second clock phase, a charge $Q = C_{REF} \times \Delta u = C_{REF} \times (V_{ref} - V_{GND})$ is displaced to the integrator I.

If the comparator outputs an output data bit D with a low logic value (D=0), the two switches S1, S2 are operated in antiparallel or phase opposition, in a first clock phase the switch S1 connecting the reference capacitor $C_{REF}$ to ground (GND), and the switch S2 connecting the reference capacitor $C_{REF}$ to the voltage source such that the reference capacitor $C_{REF}$ is recharged. Subsequently, in a second clock phase the switch S1 connects the reference capacitor $C_{REF}$ to the integrator I, and the switch S2 connects the reference capacitor $C_{REF}$ to ground (GND), and so the recharged capacitor $C_{REF}$ is discharged via the switch S2, and draws a charge $Q = C \times \Delta u$ from the input of the integrator I. If the logic output data bit D of the comparator is logically high (D=1), a charge packet Q is output to the integrator I in a clock cycle T from in-phase switching of the switches S1, S2. If, vice versa, the data bit D is logically low (D=0), a charge packet Q is drawn from the integrator I in a clock cycle T because of the operation of the switches S1, S2 in phase opposition.

The sigma/delta modulator according to the prior art which are illustrated in FIGS. 5, 6 certainly greatly diminish the sensitivity to clock jitter, but they have the substantial disadvantage that sizeable voltage jumps Δu occur at the signal input of the integrator 5. Consequently, the sigma/delta modulators according to the prior art which are illustrated in FIGS. 5, 6 require operational amplifiers which operate particularly quickly. Such operational amplifiers require a very high supply current, however.

SUMMARY

It is therefore the object of the present invention to provide a time-continuous sigma/delta analog-to-digital converter for converting an analog input signal into a digital output signal which is insensitive to clock jitter in the clock signal CLK and which at the same time requires only a low supply current.

This object is achieved a time-continuous sigma/delta analog-to-digital converter according to embodiments of the invention.

The invention provides a time-continuous sigma/delta analog-to-digital converter for converting an analog input signal into a digital output signal, having at least one analog filter which filters the analog input signal present at a signal input of the analog filter;

a quantizer which is clocked by a clock signal (CLK) and quantizes the filtered analog signal, output by the filter, in order to generate the digital output signal (D), and having at least one reference capacitor ($C_{REF}$) which can be continuously recharged to a reference voltage ($V_{REF}$) by a current source for displacing a constant charge (Q) to/from the signal input of the analog filter, such that no voltage jumps occur at the signal input of the analog filter.

One input stage of the analog filter is preferably an integrator.

In preferred embodiments of the time-continuous sigma/delta analog-to-digital converter according to the invention, the displacement of the constant charge (Q) to/from the signal input of the analog filter is performed as a function of the digital output signal (D) of the quantizer.

It is preferred in this case that the constant charge (Q) is displaced to the signal input of the analog filter in a first logic state of the digital output signal (D=1), and that the constant charge (Q) is drawn from the signal input of the analog filter in a second logic state of the digital output signal (D=0).

In a preferred embodiment, the time-continuous sigma/delta analog-to-digital converter according to the invention includes a second current source, by means of which the reference capacitor ($C_{REF}$) can be continuously charged to a second reference voltage in order to draw a constant charge (Q) from the signal input of the analog filter (3).

In a particularly preferred embodiment of the time-continuous sigma/delta analog-to-digital converter according to the invention, the quantizer has a number of quantization stages.

In this case the quantization signal is preferably fed back via a number of parallel-connected capacitor branches.

The reference capacitor ($C_{REF}$) can preferably be switched to the signal input of the analog filter via a first controllable switch.

The reference capacitor ($C_{REF}$) preferably can be switched to the current source via a second controllable switch for the purpose of continuously charging to a reference voltage.

In a preferred embodiment of a time-continuous sigma/delta analog-to-digital converter, a switch control logic is provided which drives the controllable switch as a function of the digital output signal (D).

The current sources are preferably formed by transistors at whose control electrodes a bias current is present in each case.

In a particularly preferred embodiment of the time-continuous sigma/delta analog-to-digital converter according to the invention, the sigma/delta analog-to-digital converter is of fully differential design.

The controllable switches are preferably formed by transistors in a preferred embodiment.

Preferred embodiments of the time-continuous sigma/delta analog-to-digital converter according to the invention are described below with reference to the attached Figures for the purpose of explaining features essential to the invention.

BRIEF DESCRIPTION OF THE DRAWINGS

In the drawing

FIG. 10 shows signal diagrams for explaining the mode of operation of the preferred embodiment of the sigma/delta modulator according to the invention illustrated in FIG. 9.

DETAILED DESCRIPTION

Figure 1:
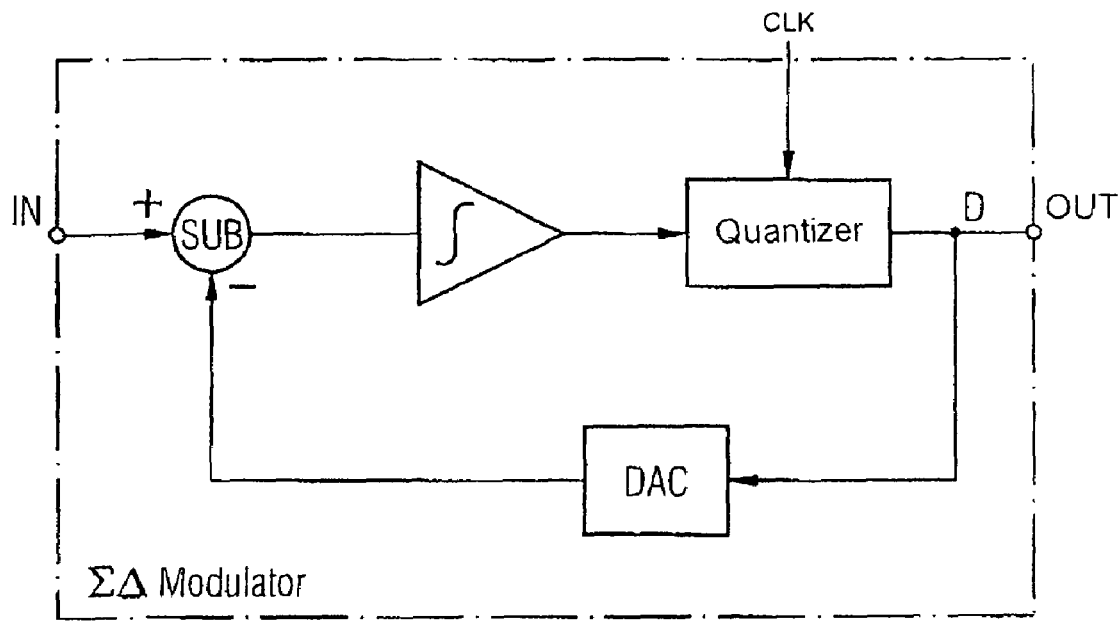
FIG. 1 shows a first sigma/delta modulator according to the prior art.
Figure 2:
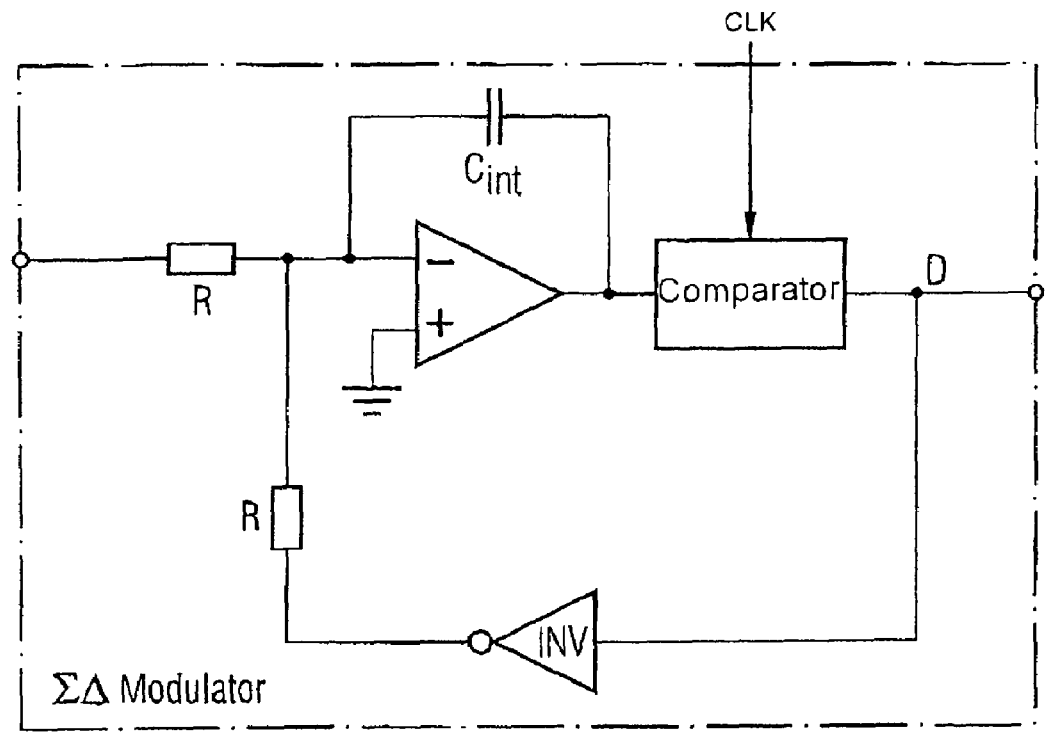
FIG. 2 shows a further sigma/delta modulator according to the prior art.
Figure 3A:
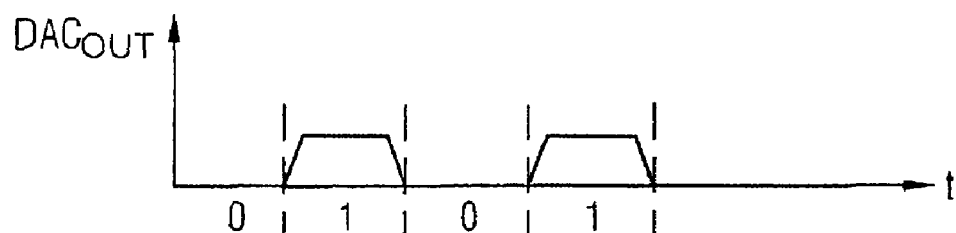
FIG. 3 shows NRZ approximation signals for the feedback branch of a sigma/delta modulator.
Figure 3B:
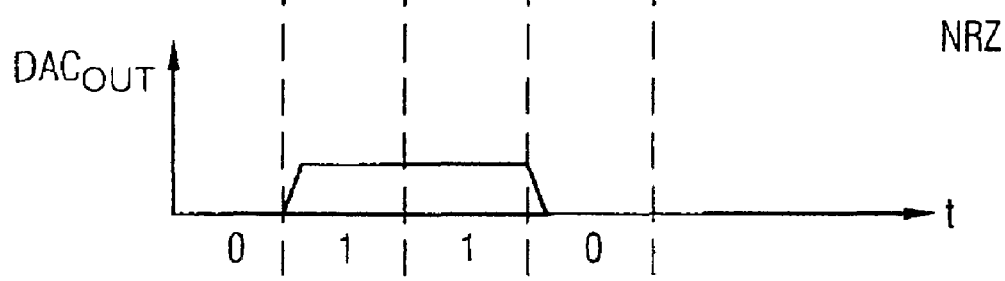
Figure 4A:
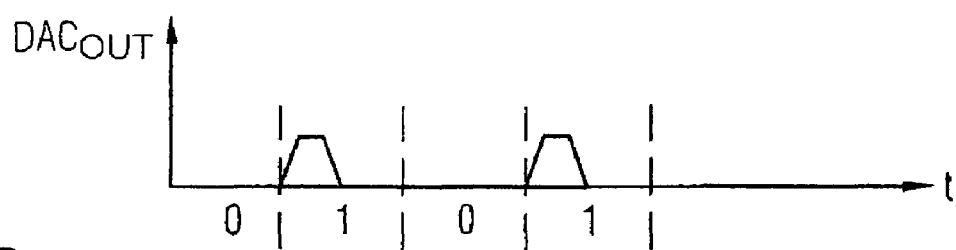
FIG. 4 shows RZ approximation signals for the feedback branch of a sigma/delta modulator.
Figure 4B:
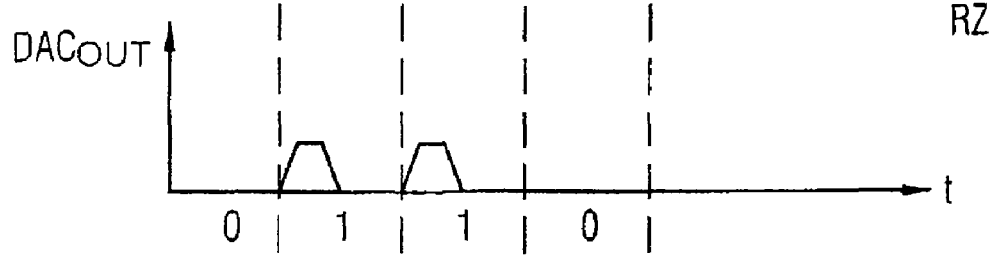
Figure 5:
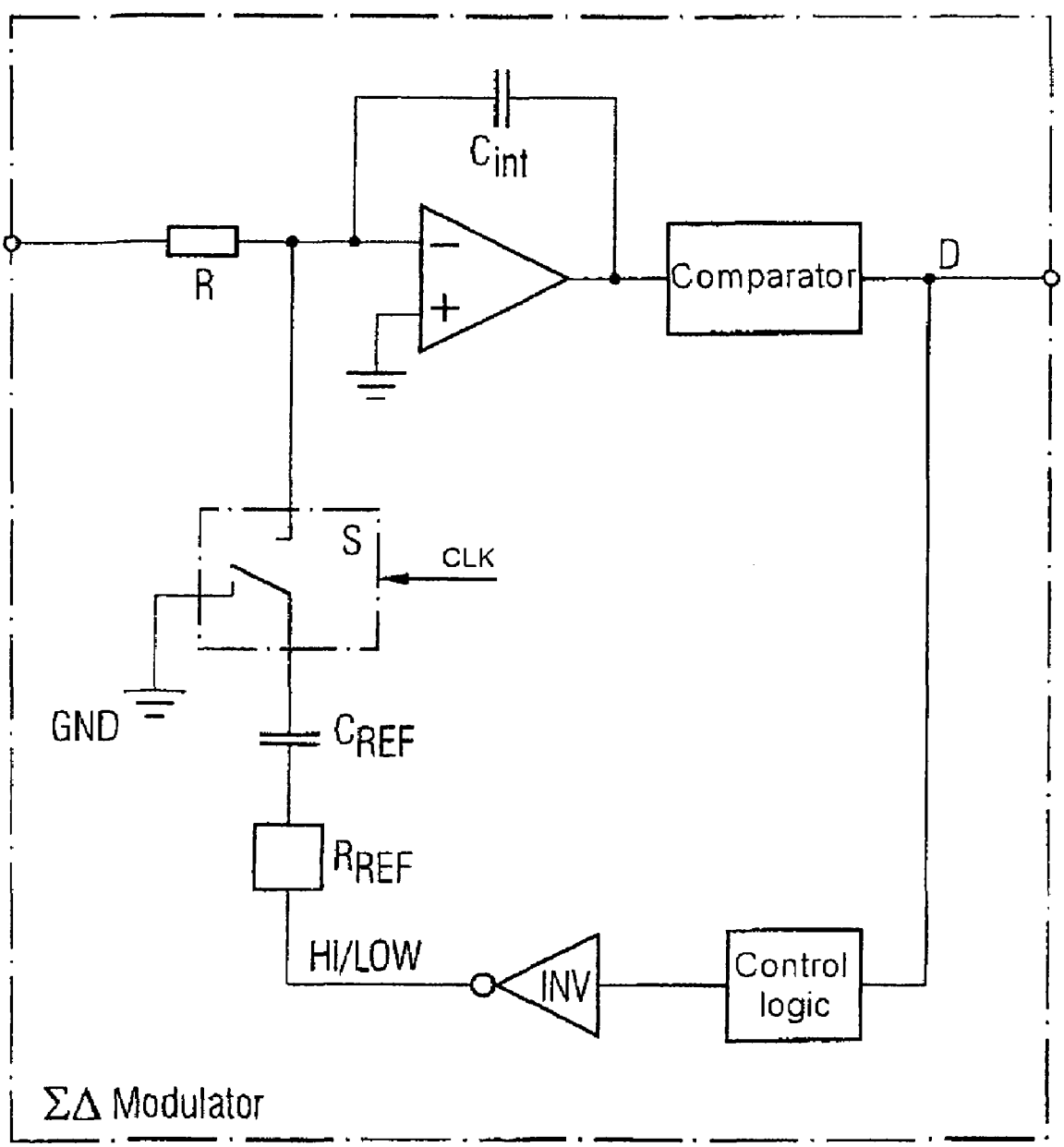
FIG. 5 shows a sigma/delta modulator according to the prior art having a switched capacitor in the feedback branch.
Figure 6:
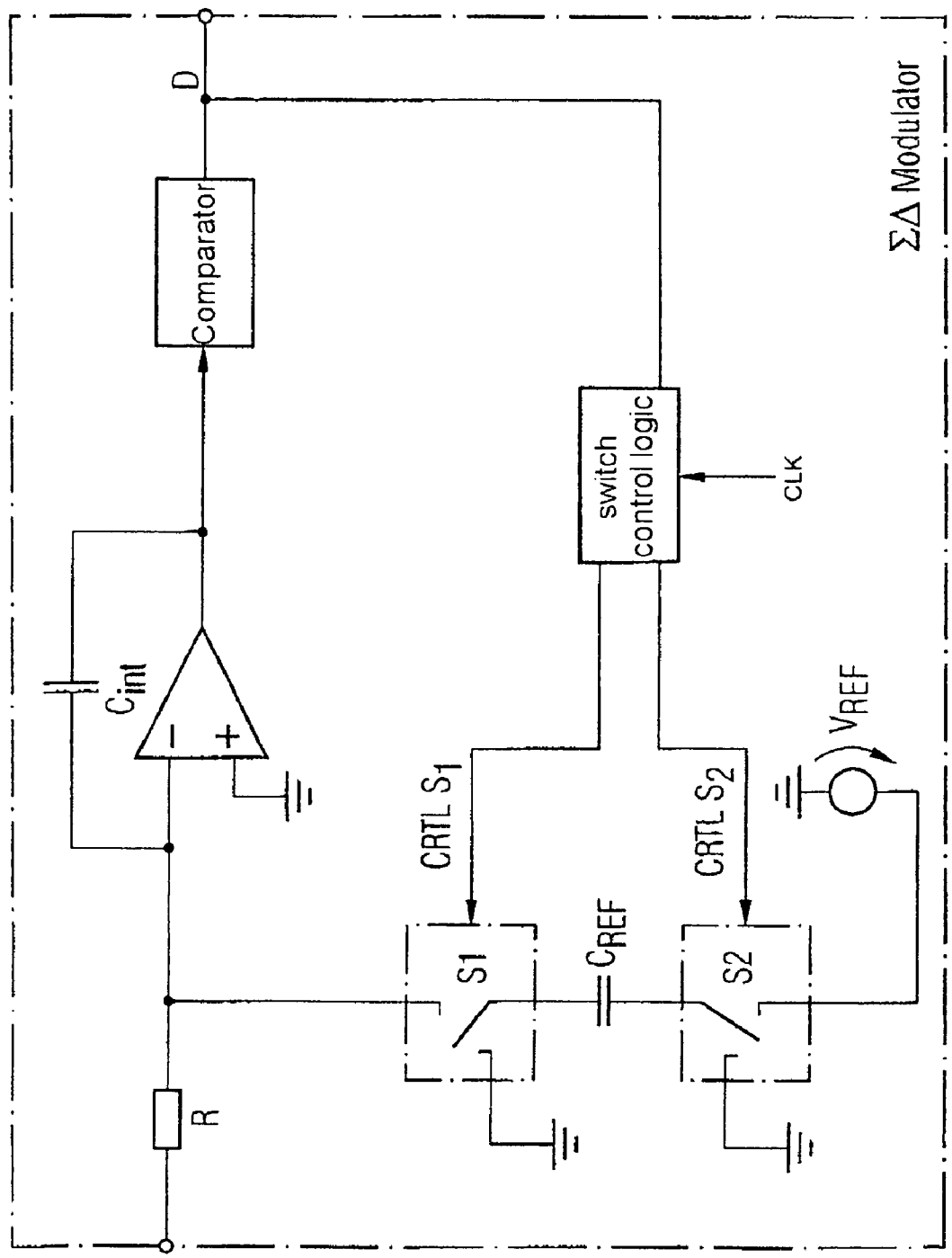
FIG. 6 shows a further sigma/delta modulator according to the prior art having a switched capacitor in the feedback branch.
Figure 7:
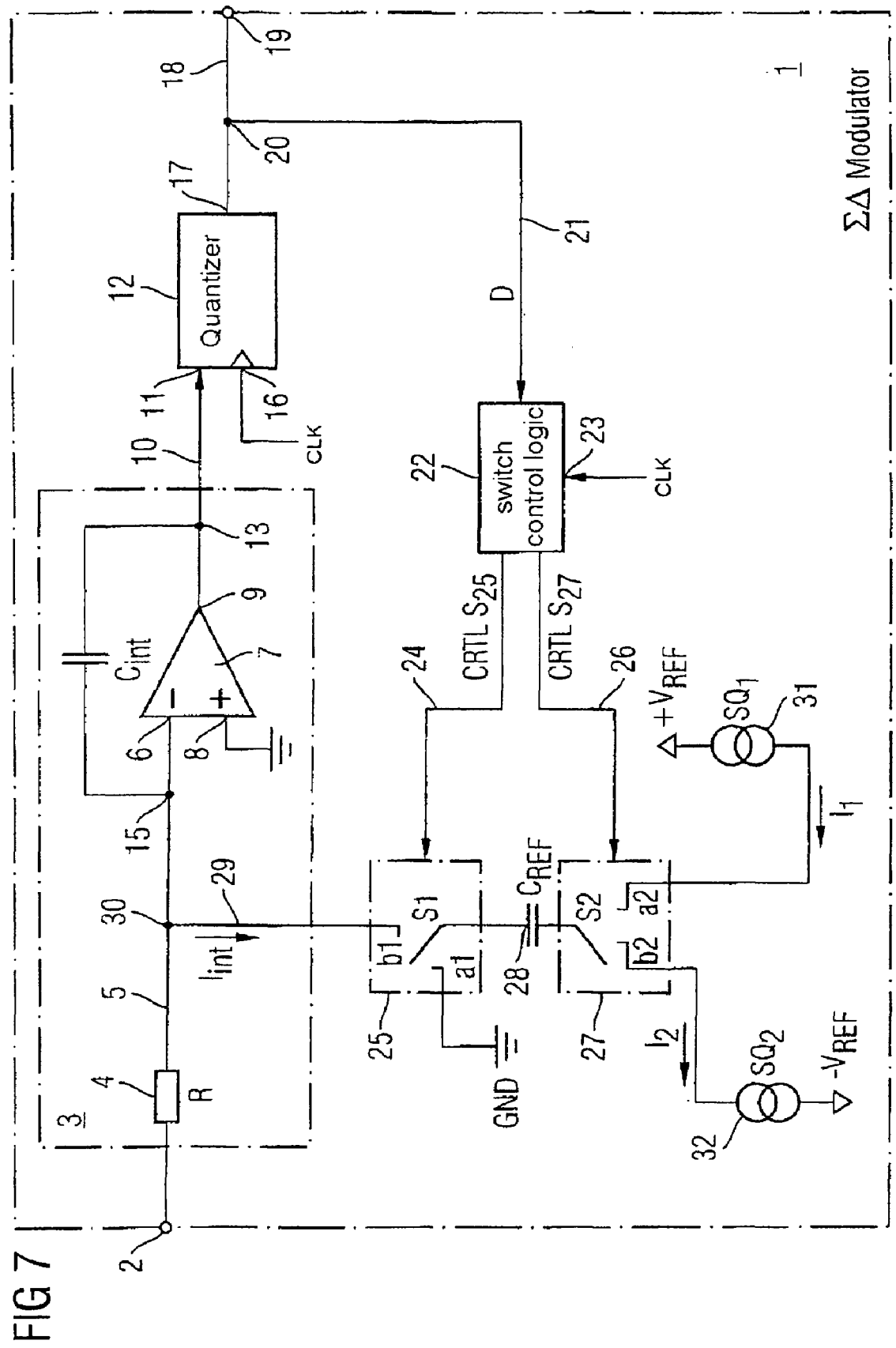
FIG. 7 shows a first embodiment of the sigma/delta modulator according to the invention.

FIG. 7 shows a first embodiment of the sigma/delta modulator 1 according to the invention. The sigma/delta modulator 1 has a signal input 2 for applying an analog input signal E. The analog signal E is fed to an analog filter 3 which comprises an integrator circuit in the case of the embodiment illustrated in FIG. 7. The integrator 3 includes a resistor 4 which is connected via a line 5 to an inverting signal input 6 of an operational amplifier 7. A non-inverting signal input 8 of the operational amplifier 7 is connected to ground GND. The operational amplifier 7 has a signal output 9 which is connected via a line 10 to an input 11 of a quantizer 12. At a node 13, the output signal of the operational amplifier 7 is fed back via a capacitor 14 to a node 15 which is connected to the inverting signal input 6 of the operational amplifier 7.

The quantizer 12 has a clock signal input 16 for the application of a clock signal CLK. The quantizer 12 quantizes the filtered analog signal output by the analog filter 3 in order to generate a digital output signal (D) which is output from a digital output 17 of the quantizer 12 to a digital output 19 of the sigma/delta modulator 1 via an internal line 18. The digital output signal (D) is tapped at a node 20 and fed to a switch control logic 22 via a feedback line 21. In one embodiment, the quantizer 12 is a comparator which supplies a digital output signal (D) with single bit resolution. In the case of alternative embodiments, the quantizer 12 has a number of quantizer stages and supplies a digital output signal (D) comprising a number of bits. The feedback of the digital output signal (D) is then performed via parallel-connected capacitor branches.

The switch control logic 22 has a clock signal input 23 for the application of the clock signal CLK. The switch control logic 22 controls a first controllable switch 25 via a first control line 24, and a second controllable switch 27 via a second control line 26. The two switches 25, 27 are connected to a reference capacitor 28. Via the first controllable switch 25, the reference capacitor 28 can be switched to a node 30 via a line 29, the node 30 being connected to the inverting signal input 6 of the operational amplifier 7.

Depending on the control signal ($C_{RTL-S25}$) received via the line 24, the first controllable switch 25 switches the reference capacitor 28 to ground in a first switch position ($a_1$), and to the node 30 in a second switch position ($b_1$). If the first controllable switch 25 is in the first switch position ($a_1$), the reference capacitor 28 is precharged in a preparatory phase VP.

Depending on the second control signal ($C_{RTL-S27}$) received via the control line 26, the second controllable switch 27 switches the reference capacitor 28 to a first real current source 31 in a first switch position ($a_2$), and to a second real current source (32) in a second switch position ($b_2$).

In a further embodiment (not illustrated), the sigma/delta modulator 1 includes only a first current source 31, and the second switch 27 switches the reference capacitor 28 to ground (GND) in the second switch position ($b_2$).

In a further embodiment (not illustrated), an additional controllable switch is connected in parallel with the at least one current source 31, 32, which is provided for precharging the reference capacitor 28 in a preparatory phase VP. By closing this switch, it is possible in the preparatory phase VP to precharge the capacitor 28 suddenly to the reference voltage ($+V_{REF}$, $-V_{REF}$) connected to the corresponding current source 31, 32. The precharging time required for the preparatory phase VP can thereby be substantially reduced, and the integration phase IP can be correspondingly extended.

The reference capacitor 28 can be continuously charged to a reference voltage ($+V_{REF}$) by the first current source 31 for displacing a constant charge (Q) to the node 30 of the analog filter 3. In the process, the constant charge (Q) is displaced to or from the node 30 of the analog filter 3 in a fashion controlled by the switch control logic 22 as a function of the digital output signal (D) of the quantizer 12.

In a first logic state of the digital output signal (D=1), the constant charge (Q) or the charge packet is displaced to the signal input of the analog filter 3. In a second logic state of the digital output signal (D=0), the constant charge (Q) is drawn from the signal input of the analog filter 3. Provided in the case of the embodiment of the sigma/delta modulator 1 illustrated in FIG. 7 is the second current source 32, by means of which the reference capacitor 28 can be charged continuously to a second reference voltage ($-V_{REF}$) in order to draw the constant charge (Q) from the signal input of the analog filter 3.

FIG. 8 illustrates the mode of operation of the sigma/delta modulator 1, illustrated in FIG. 7, in accordance with the invention for an output bit sequence D="0 1 1 0".

Figure 8A:
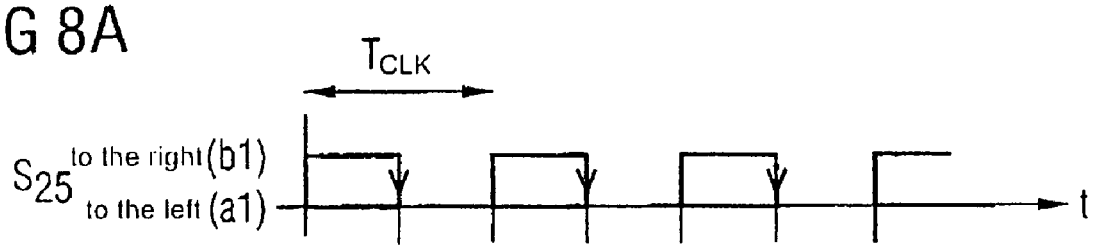
FIG. 8 shows signal diagrams for explaining the mode of operation of the sigma/delta modulator according to the invention illustrated in FIG. 7.

FIG. 8a shows the control signal CRTL-S1 for the first controllable switch 25, which is generated by the switch control logic 22, clocked by a clock signal CLK, as a function of the digital output signal (D).

Figure 8B:
Figure 8C:
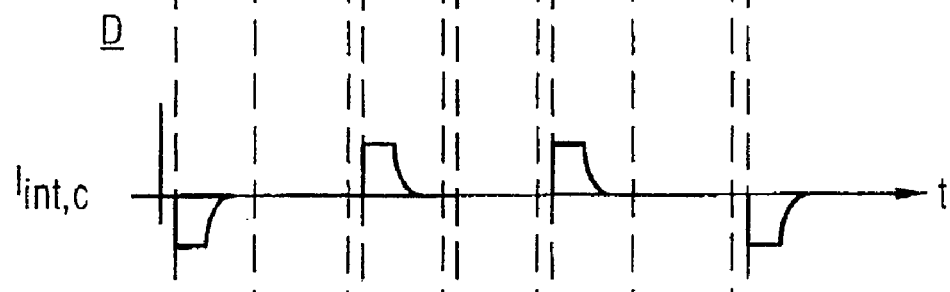

FIG. 8b shows the second control signal CRTL-S2 for the second controllable switch 27, which is likewise generated by the switch control logic 22 as a function of a digital output signal (D). A minimum time offset ensures that the second switch 27 does not switch over before the first switch 25.

As illustrated in FIG. 7, the sigma/delta analog-to-digital converter 1 according to the invention operates in two phases. In a preparatory phase VP, the reference capacitor 28 is precharged, and in an integration phase IP, the reference capacitor 28 is subsequently recharged, a charge packet with a constant charge Q being displaced as a function of the logic state of the digital output signal D to the summing node 30, or being drawn from the summing node 30.

The first controllable switch 25 is switched to and fro between its two switch positions $a_1$, $b_1$ as a function of the clock signal CLK. In this process, the first controllable switch 25 is in the preparatory phase VP in the switch position $a_1$ and in the integration phase IP in the switch position $b_1$. In the preparatory phase VP, the controllable first switch 25 therefore connects the reference capacitor 28 on one side to the reference potential GND.

The second controllable switch 27 is switched between the switch positions $a_2$, $b_2$ as a function of the logic state of the digital output signal D.

In this case, in a first logic state of the digital output signal D the switch 27 is switched into the switch position $a_2$ in the preparatory phase VP, and switched over from there into the switch position $b_2$ in the integration phase IP. If the digital output signal D has a second logic state, the switch 27 is switched inversely into the switch position $b_2$ in the preparatory phase VP, and from there into the switch position $a_2$ in the integration phase IP. The first logic state of the output bit therefore leads to a negative signal edge, and the second logic state leads to a positive signal edge at the reference capacitor 28. Consequently, in the first logic state a constant charge Q is drawn from the summing node 30 via the closed switch 25, and in a second logic state of the digital output signal a constant charge is displaced to the summing node 30 via the closed switch 25.

The following table shows the switch positions of the switches 25, 27 in the preparatory phase VP and integration phase IP of the sigma/delta analog-to-digital converter 1 in accordance with FIG. 7.

|  | Switch S25 | Switch S27 (D = 0) | Switch S27 (D = 1) |
|---|---|---|---|
| Preparatory phase | $a_1$ | $a_2$ | $b_2$ |
| Integration phase | $b_1$ | $b_2$ | $a_2$ |

Figure 8D:
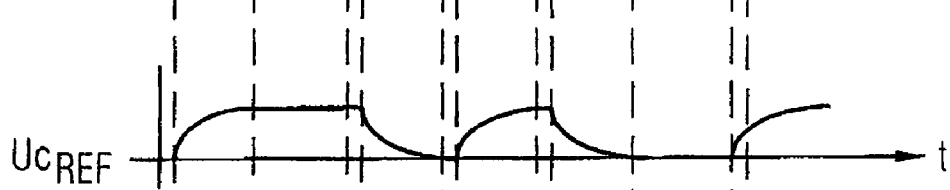

Because of the continuous charging operations at the reference capacitor 28, which are effected by the real current sources 31, 32, no voltage jumps $\Delta U$ occur at the inverting signal input 6. As illustrated in FIG. 8*d*, the voltage profile at the reference capacitor 28 is continuous. Consequently, no voltage jumps occur at the virtual signal input 6 of the operational amplifier 7. It is therefore possible, in the case of the sigma/delta modulator 1 according to the invention, to make use of relatively slowly operating operational amplifiers 7 which have a correspondingly low current or power consumption.

Because of the rechargeable reference capacitor 28 in the feedback branch, the sigma/delta modulator 1 according to the invention is, moreover, insensitive to fluctuations in the clock signal CLK, since the charge (Q) displaced to the summing point 30 or drawn from the summing point 30 remains very largely constant by virtue of the exponentially falling discharge curve even when clock signal fluctuations or clock jitter occur.

As illustrated in FIG. 7, the sigma/delta modulator 1 according to the invention therefore has a low power consumption and is at the same time insensitive to clock signal jitter.

Figure 8E:
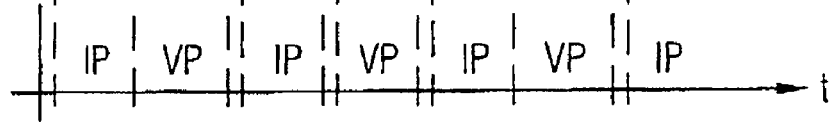

FIG. 8*e* shows the alternately occurring integration phases (IP) and preparatory phases (VP) in the case of the analog-to-digital converter according to the invention.

Figure 9:
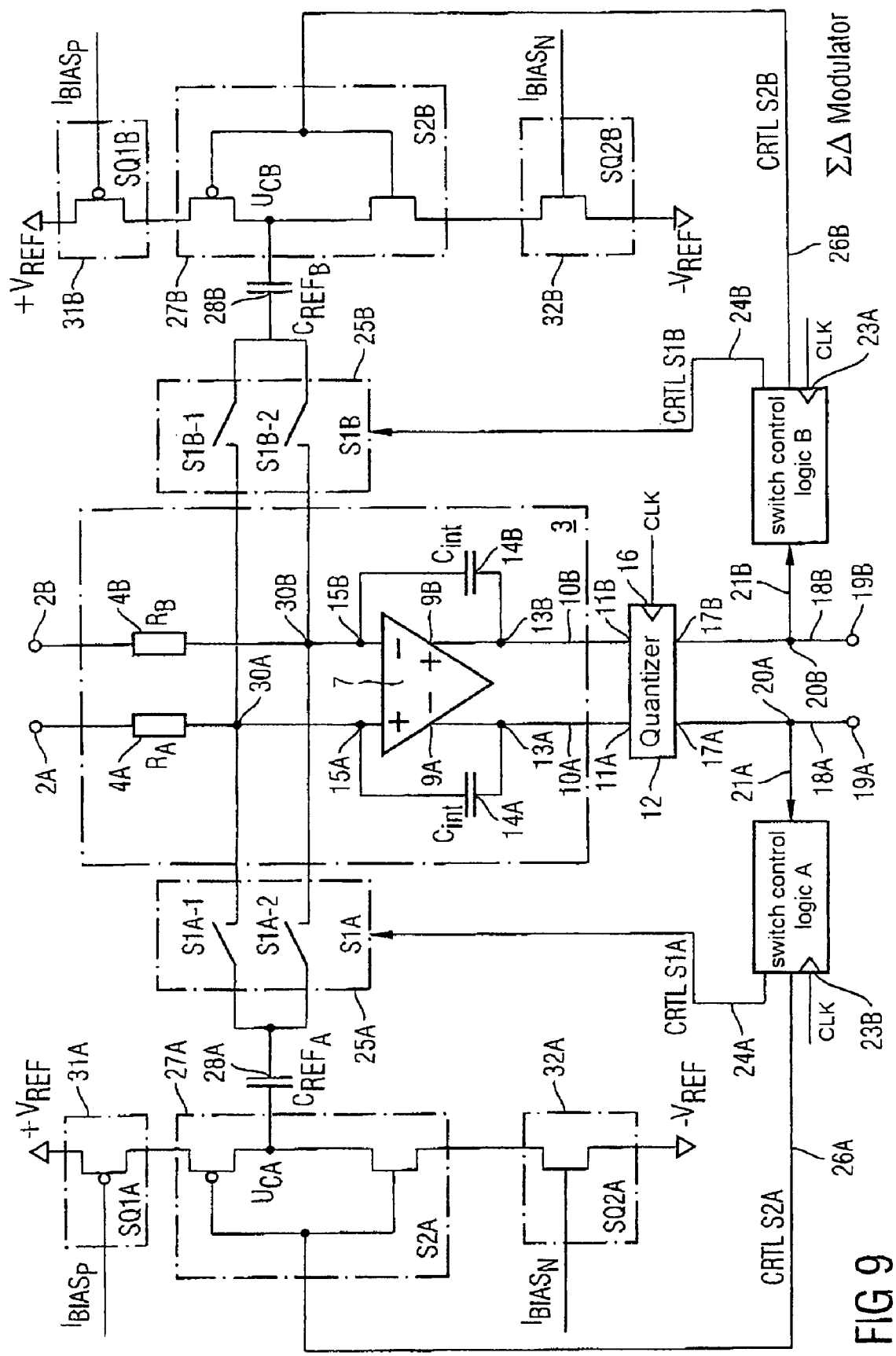
FIG. 9 shows a preferred embodiment of the sigma/delta modulator according to the invention.

FIG. 9 shows a preferred embodiment of the time-continuous sigma/delta analog-to-digital converter 1 according to the invention. The sigma/delta modulator 1 is of fully differential design in the case of the embodiment illustrated in FIG. 9.

FIG. 10 shows signal diagrams for explaining the mode of operation of the sigma/delta modulator 1, illustrated in FIG. 9, of fully differential design for an exemplary digital output bit sequence (D="0 1 1 0") at the output of the quantizer 12. The first controllable switches 25*a*, 25*b* respectively include switches S1A-1, S1A-2 and S1B-1, S1B-2, respectively, which are switched in a complementary fashion as a function of the control signal present. If S1A-1 is closed, the switch S1A-2 is open, and vice versa. If the switch S1B-1 is open, the switch S1B-2 is closed, and vice versa.

As may be seen from FIGS. 10*e*, 10*f*, the reference capacitors 28A, 28B always transfer charge packets in opposite directions at an input of the operational amplifier 7.

The reference capacitors 28A, 28B alternately shift charge packets with a constant charge Q from the respective current source 31A, 31B to the summing nodes 30A, 30B via the associated switch 27A, 27B.

There are two combinations of switch positions in the case of the preferred embodiment shown in FIG. 9.

In the first combination of switch positions, the switch S1A-1 and the switch S1B-2 are closed, while the switches S1A-2 and S1B-1 are open.

In the case of the second combination of switch positions, the switch S1B-1 and the switch S1A-2 are closed, while the switches S1B-2 and S1A-1 are open.

Since the reference capacitors 28A, 28B alternately displace charges Q in the direction of the operational amplifier 7, the previous switch position combinations are retained when the output data bit sequence at the output of the quantizer 12 has a change of logic state, D="0 1" or D="1 0". As may be seen in FIG. 10, the switch positions remain constant during the data transitions D="0 1" and D="1 0".

If there is no change of state at the data output of the quantizer 12, the existing switch combination is changed, that is to say the switches S1A-1, S1A-2, S1B-1, S1B-2 switch from their previous switching state into the respectively complementary switching state. As may be seen in FIG. 10, this comes about, for example, when the digital output signal D has a sequence of two consecutive output bits of logically identical value 1 (D="..11..").

By contrast with the single-ended embodiment of the sigma/delta modulator 1 illustrated in FIG. 7, the advantage of the sigma/delta modulator 1 according to the invention and illustrated in FIG. 9, which embodiment is of fully differential design, resides in the fact the sigma/delta modulator 1 of fully differential design in accordance with FIG. 9 requires no preparatory phase, but carries out an integration in each clock phase of the clock signal. Whereas in the case of the embodiment illustrated in FIG. 7, no displacement of charge to the summing note 30 takes place in a preparatory phase, and thus no integration can be carried out during this time, in the case of the fully differential embodiment of the sigma/delta modulator 1 according to the invention a displacement of charge at the summing nodes 30A, 30B takes place at every instant, that is to say every clock phase of the clock signal CLK is followed by an integration. In the case of the embodiment of the sigma/delta modulator 1 of fully differential design illustrated in FIG. 9, it is therefore possible to operate with an even slower operational amplifier 7 of differential design, and thus to lower the current or power consumption further.

In the case of a sigma/delta modulator 1 of fully differential design in accordance with FIG. 9, the left-hand circuit part and the right-hand circuit part operate in different directions. At the start of each clock cycle, the reference capacitors 28A, 28B are charged in different directions.

In the case of the two embodiments of the time-continuous sigma/delta and analog-to-digital converter 1 according to the invention and illustrated in FIGS. 7, 9, current sources 31, 32 are connected in series with the reference capacitor 28. These current sources 31, 32 are preferably formed by transistors. The transistors can be bipolar or field effect transistors. The control electrodes of the transistors in this case maintain a bias current $I_{BIAS}$. The current sources 31, 32 formed from transistors automatically limit the current when the reference capacitor 28 is charged completely to the supply reference voltage $V_{REF}$. The sigma modulator 1 according to the invention generates a current pulse whose integrated transfer charge Q is independent of clock signal jitter. The entirely displaced or transferred charge Q per clock cycle T is yielded from the product of the capacitance $C_{REF}$ of the reference capacitor 28 and the voltage $\Delta U$ present thereon.

The invention claimed is:

1. A time-continuous sigma/delta analog-to-digital converter, comprising:
   at least a first analog filter configured to generate a filtered analog signal from an analog input signal;
   a clocked quantizer configured to receive and quantize the filtered analog signal in order to generate a digital output signal;
   at least a first reference capacitor configured to be continuously charged to a reference voltage by a current source in order to displace a constant charge to the first analog filter, such that voltage jumps due to clocking signals are substantially reduced at the first analog filter; and
   a second reference capacitor configured to be continuously charged to the reference voltage by the current source in order to displace the constant charge to the first analog filter.

2. The time-continuous sigma/delta analog-to-digital converter according to claim 1, wherein one input stage of the first analog filter comprises an integrator.

3. The time-continuous sigma/delta analog-to-digital converter according to claim 1, wherein the displacement of the constant charge to the first analog filter is selectively performed as a function of the digital output signal.

4. The time-continuous sigma/delta analog-to-digital converter according to claim 1, wherein the first reference capacitor is configured to displace the constant charge to the first analog filter in a first logic state of the digital output signal, and to displace a constant charge from the first analog filter in a second logic state of the digital output signal.

5. The time-continuous sigma/delta analog-to-digital converter according to claim 1, further comprising a second current source configured to continuously charge the first reference capacitor to a second reference voltage in order to draw a constant charge from the first analog filter.

6. The time-continuous sigma/delta analog-to-digital converter according to claim 5, wherein the second current source comprises at least one transistor having a control electrode operably connected to a bias current.

7. The time-continuous sigma/delta analog-to-digital converter according to claim 1, wherein the first reference capacitor is configured to be selectively coupled to the first analog filter via a first controllable switch.

8. The time-continuous sigma/delta analog-to-digital converter according to claim 7, wherein the second reference capacitor is configured to be selectively coupled to the first analog filter via a second controllable switch.

9. The time-continuous sigma/delta analog-to-digital converter according to claim 1, wherein the first reference capacitor is configured to be selectively coupled to the current source via a second controllable switch for the purpose of continuously charging to the reference voltage.

10. The time-continuous sigma/delta analog-to-digital converter according to claim 9, further comprising a switch control logic configured to drive the second controllable switch as a function of the digital output signal.

11. The time-continuous sigma/delta analog-to-digital converter according to claim 1, wherein the sigma/delta analog-to-digital converter includes a differential input.

12. The time-continuous sigma/delta analog-to-digital converter according to claim 1, wherein the first analog filter includes an operational amplifier.

13. The time-continuous sigma/delta analog-to-digital converter according to claim 12, wherein the first reference capacitor is switchably connected to a terminal of the operational amplifier.

14. The time-continuous sigma/delta analog-to-digital converter according to claim 12, wherein the first reference capacitor is operably connected in series between a terminal of the operational amplifier and the current source.

15. The time-continuous sigma/delta analog-to-digital converter according to claim 1, wherein the first analog filter includes a capacitor distinct from the first and second reference capacitors.

16. The time-continuous sigma/delta analog-to-digital converter according to claim 1, wherein the clocked quantizer has single bit resolution.

17. The time-continuous sigma/delta analog-to-digital converter according to claim 1, wherein the clocked quantizer has multiple bit resolution.

18. The time-continuous sigma/delta analog-to-digital converter according to claim 1, wherein the first analog filter includes an operational amplifier and a capacitor.

19. The time-continuous sigma/delta analog-to-digital converter according to claim 1, wherein the current source includes a first current source circuit coupled to the first reference capacitor and a second current source circuit coupled to the second reference capacitor.

20. The time-continuous sigmaldelta analog-to-digital converter according to claim 1, wherein the current source includes at least one transistor connected to a reference voltage source.

* * * * *